United States Patent
Tsuchiya

(10) Patent No.: US 12,327,789 B2
(45) Date of Patent: Jun. 10, 2025

(54) SEMICONDUCTOR DEVICE

(71) Applicant: SEIKO EPSON CORPORATION, Tokyo (JP)

(72) Inventor: Masahiko Tsuchiya, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 596 days.

(21) Appl. No.: 17/705,773

(22) Filed: Mar. 28, 2022

(65) Prior Publication Data

US 2022/0319986 A1  Oct. 6, 2022

(30) Foreign Application Priority Data

Mar. 30, 2021 (JP) ................................. 2021-057998

(51) Int. Cl.
| | |
|---|---|
| *H01L 23/522* | (2006.01) |
| *H01L 23/528* | (2006.01) |
| *H01L 23/58* | (2006.01) |
| *H02M 1/00* | (2007.01) |
| *H02M 3/00* | (2006.01) |
| *H10D 1/47* | (2025.01) |
| *H02M 3/335* | (2006.01) |

(52) U.S. Cl.
CPC .......... *H01L 23/5228* (2013.01); *H10D 1/47* (2025.01); *H02M 3/33523* (2013.01)

(58) Field of Classification Search
CPC ............ H01L 23/5228; H01L 23/5283; H01L 23/552; H01L 23/585; H01L 28/20; H02M 3/33523; H02M 3/003; H02M 1/0006; H10D 1/47
See application file for complete search history.

(56) References Cited

U.S. PATENT DOCUMENTS

| | | | | |
|---|---|---|---|---|
| 2008/0117653 A1* | 5/2008 | Saito | ..................... | H01L 29/405 |
| | | | | 257/E27.047 |
| 2010/0148823 A1* | 6/2010 | Shimizu | ............... | H10D 84/151 |
| | | | | 326/102 |
| 2012/0154026 A1* | 6/2012 | Karino | ................. | H10D 84/209 |
| | | | | 257/256 |
| 2014/0374837 A1 | 12/2014 | Ichikawa | | |
| 2015/0311197 A1* | 10/2015 | Saito | ..................... | H10D 84/00 |
| | | | | 257/272 |

(Continued)

FOREIGN PATENT DOCUMENTS

| | | |
|---|---|---|
| JP | 2008-153636 | 7/2008 |
| JP | 2015-008222 | 1/2015 |

(Continued)

*Primary Examiner* — Omar F Mojaddedi
(74) *Attorney, Agent, or Firm* — Rankin, Hill & Clark LLP

(57) ABSTRACT

A semiconductor device includes: a semiconductor substrate of a first conductivity type; a first impurity layer of a second conductivity type formed at a surface of the semiconductor substrate; a second impurity layer of a first conductivity type formed to surround the first impurity layer of the semiconductor substrate; an insulating film configured to cover at least the first impurity layer; a resistive element provided on the insulating film and having a spiral shape; a first interlayer insulating layer configured to cover the resistive element; and a plurality of first conductive films provided on the first interlayer insulating layer and electrically coupled with the resistive element.

3 Claims, 8 Drawing Sheets

(56) References Cited

U.S. PATENT DOCUMENTS

2017/0040296 A1\* 2/2017 Das ................... H01L 23/49866
2017/0047442 A1   2/2017 Kumano
2020/0411508 A1   12/2020 Hayashi

FOREIGN PATENT DOCUMENTS

JP   2017-038022   2/2017
JP   2021-009888   1/2021

\* cited by examiner

SEMICONDUCTOR DEVICE

The present application is based on, and claims priority from JP Application Serial Number 2021-057998, filed Mar. 30, 2021, the disclosure of which is hereby incorporated by reference herein in its entirety.

BACKGROUND

1. Technical Field

The present disclosure relates to a semiconductor device.

2. Related Art

In the related art, a switching power supply apparatus that generates an output voltage by rectifying and smoothing a DC voltage by turning on and off a switching element has been known. The DC voltage is obtained from an AC voltage by an AC power supply. In addition, in general, it has been known that ON and OFF of the switching element is controlled by a power supply controller constituted by, for example, a semiconductor.

The power supply controller disclosed in JP-A-2008-153636 is a semiconductor device constituted by a semiconductor. In general, the semiconductor device is resin-sealed in a subsequent step of a manufacturing process of the semiconductor device. Performance of the semiconductor device may decrease due to influence of foreign substances such as ions contained in the resin. It is considered to shield various elements such as a resistive element by a conductive film such as a metal wiring in the semiconductor device to prevent the decrease in performance, but when a voltage of no lower than a breakdown voltage is applied to an interlayer insulating layer between the conductive film and the elements, the interlayer insulating layer may be broken.

SUMMARY

An aspect of a semiconductor device according to the present disclosure includes:
- a semiconductor substrate of a first conductivity type;
- a first impurity layer of a second conductivity type formed at a surface of the semiconductor substrate;
- a second impurity layer of a first conductivity type formed to surround the first impurity layer of the semiconductor substrate;
- an insulating film configured to cover at least the first impurity layer;
- a resistive element provided on the insulating film and having a spiral shape;
- a first interlayer insulating layer configured to cover the resistive element; and
- a plurality of first conductive films provided on the first interlayer insulating layer and electrically coupled with the resistive element.

DESCRIPTION OF EXEMPLARY EMBODIMENTS

Hereinafter, preferred embodiments of the present disclosure will be described with reference to the drawings. The used drawings are for convenience of description. The embodiments described below do not unduly limit contents of the present disclosure described in the claims. In addition, not all configurations described below are necessarily essential components of the present disclosure.

1. Configuration of Switching Power Supply Apparatus

Figure 1:
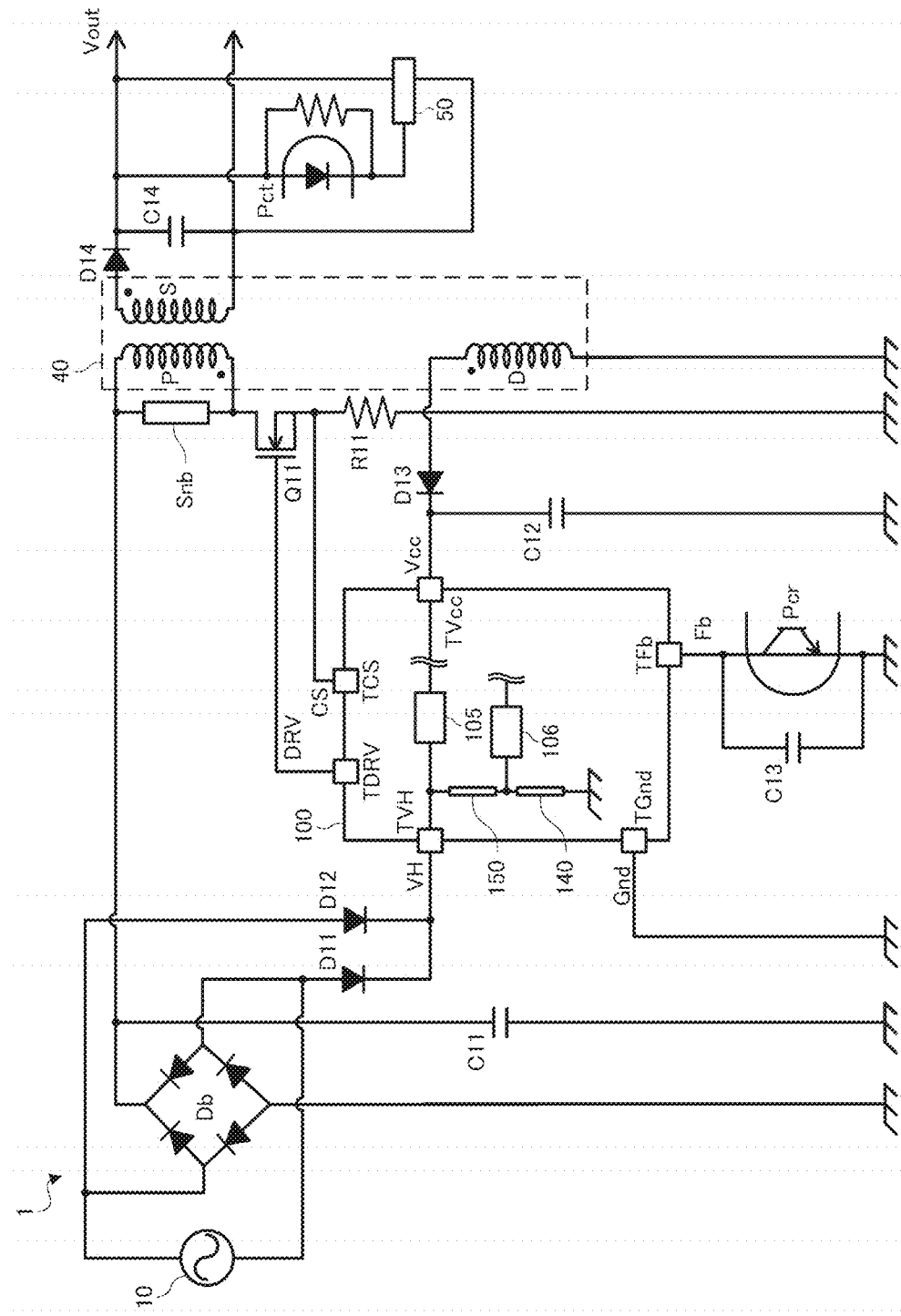
FIG. 1 is a diagram showing a schematic configuration of a switching power supply apparatus.

FIG. 1 is a configuration example of a switching power supply apparatus 1 including a power supply controller 100. The switching power supply apparatus 1 is a so-called flyback AC-DC converter. Specifically, the switching power supply apparatus 1 causes a current to flow through a primary winding P of a transformer 40 by turning on a switching element Q11 to store energy therein. The switching power supply apparatus 1 outputs the energy stored in the primary winding P from a secondary winding S of the transformer 40 via a diode D14 by turning off the switching element Q11. The switching power supply apparatus 1 generates a DC voltage Vout by smoothing, with a capacitor C14, a voltage output from the diode D14.

The switching power supply apparatus 1 includes an AC power supply 10, the transformer 40, an error amplifier 50, the power supply controller 100, a diode bridge db, the switching element Q11, capacitors C11, C12, C13, and C14, diodes D11, D12, D13, and D14, and a resistor R11.

An AC voltage generated by the AC power supply 10 is an AC input voltage of the switching power supply apparatus 1. The diode bridge db rectifies the AC voltage generated by the AC power supply 10. A positive terminal of the diode bridge db is coupled to one end of the primary winding P of the transformer 40 and one end of the capacitor C11, and a negative terminal of the diode bridge db and the other end of the capacitor C11 are coupled to ground. For example, the ground is a ground potential. In addition, the ground is coupled to a terminal TGnd of the power supply controller 100.

The transformer 40 includes the secondary winding S and an auxiliary winding D in addition to the primary winding P. The other end of the primary winding P is coupled to a drain of the switching element Q11. The switching element Q11 is, for example, an N-channel metal oxide semiconductor field effect transistor (MOSFET), and a source thereof is coupled to one end of the resistor R11. The other end of the resistor R11 is coupled to the ground. Therefore, the primary winding P and the switching element Q11 are coupled in series between the positive terminal and the negative terminal of the diode bridge db.

A snubber circuit Snb is provided between the one end and the other end of the primary winding P of the transformer 40, and absorbs a transient voltage that is generated in the primary winding P by switching on and off the switching element Q11.

One end of the secondary winding S is coupled to an anode of the diode D14. The capacitor C14 is coupled between a cathode of the diode D14 and the other end of the secondary winding S. The voltage smoothed by the capacitor C14 is output as Vout. The diode D14 and the capacitor C14 rectify and smooth a voltage induced in the secondary winding S, and generate the Vout that is a DC output voltage of the switching power supply apparatus 1.

A light-emitting diode Pct and a phototransistor Pcr constitute a photo-coupler. An anode of the light-emitting diode Pct is coupled to the cathode of the diode D14, and a cathode of the light-emitting diode Pct is coupled to the error amplifier 50. The error amplifier 50 causes a current corresponding to a deviation between the Vout and a reference voltage of the error amplifier 50 to flow in the light-emitting diode Pct.

An anode of the diode D13 is coupled to one end of the auxiliary winding D of the transformer 40, and a cathode of the diode D13 is coupled to a terminal TVcc of the power supply controller 100 and one end of the capacitor C12. The other end of the auxiliary winding D and the other end of the capacitor C12 are coupled to the ground.

A voltage induced in the auxiliary winding D is rectified by the diode D13 and smoothed by the capacitor C12. The diode D13 and the capacitor C12 rectify and smooth the voltage induced in the auxiliary winding D, and generate a voltage Vcc input to the terminal TVcc of the power supply controller 100. The generated voltage Vcc is a power supply voltage of the power supply controller 100.

An emitter of the phototransistor Pcr is coupled to the ground, and a collector thereof is coupled to a terminal TFb of the power supply controller 100. The capacitor C13 is coupled in parallel with the phototransistor Pcr. The phototransistor Pcr causes a collector current to flow according to an amount of light received from the light-emitting diode Pct. That is, as the voltage Vout increases, the amount of light emitted by the light-emitting diode Pct increases, and accordingly the collector current of the phototransistor Pcr increases.

The power supply controller 100 is configured as, for example, an integrated circuit device. A voltage of the terminal TFb is pulled up to an internal power supply voltage thereof and the collector current of the phototransistor Pcr flows into the terminal TFb, whereby a voltage Fb of the terminal TFb is generated. The voltage Fb changes according to the collector current of the phototransistor Pcr. That is, the voltage Fb is a voltage corresponding to a deviation of the voltage Vout.

The power supply controller 100 detects the voltage Fb, and controls the switching element Q11 such that the deviation of the voltage Vout indicated by the voltage Fb becomes small. Specifically, the power supply controller 100 performs pulse width modulation (PWM)control, based on a voltage CS that is input from a terminal TCS and applied to the one end of the resistor R11 and the voltage Fb, to reduce the deviation of the voltage Vout, and generates a drive signal DRV. The drive signal DRV output from a terminal TDRV is supplied to a gate of the switching element Q11.

Although the switching element Q11 is separate from the power supply controller 100 in FIG. 1, the switching element Q11 may be integrated into the power supply controller 100.

The diodes D11 and D12 full-wave rectify the AC voltage generated by the AC power supply 10 and generate a full-wave rectified voltage VH. The full-wave rectified voltage VH is input to a terminal TVH of the power supply controller 100.

The full-wave rectified voltage VH input to the terminal TVH is stepped down by a step-down circuit 105 provided in the power supply controller 100. For example, the step-down circuit 105 includes a junction field effect transistor (JFET), and the full-wave rectified voltage VH input to the terminal TVH is stepped down from several hundreds of volts to several tens of volts or several volts by the step-down circuit 105. When a start-up circuit (not shown) is turned on, the voltage input to the terminal TVH is stepped down by the step-down circuit 105 and is output to the terminal TVcc as the voltage Vcc. The power supply controller 100 generates the voltage Vcc based on the full-wave rectified voltage VH.

2. First Embodiment

A semiconductor device 200 provided in the power supply controller 100 will be described with reference to FIGS. 2 to 4. The semiconductor device 200 includes a semiconductor substrate 201, a first impurity layer 202, a second impurity layer 203, an insulating film 204, a resistive element 150, a first interlayer insulating layer 211, and a plurality of first conductive films 110. The semiconductor device 200 further includes various elements and circuits (not shown) for achieving functions of the power supply controller 100, such as resistive elements 140 and 150, the step-down circuit 105, and an AC detection circuit 106.

For example, the step-down circuit 105 steps down the full-wave rectified voltage VH input to the terminal TVH. In addition, the resistive elements 140, 150 divide the full-wave rectified voltage VH, and the divided voltages are detected by the AC detection circuit 106.

The semiconductor substrate 201 is a substrate forming a so-called semiconductor element. The semiconductor substrate 201 is of a conductivity type of p-type as a first conductivity type. The semiconductor substrate 201 is formed of, for example, a p-type silicon substrate.

The first impurity layer 202 is formed at a surface of the semiconductor substrate 201. The first impurity layer 202 is of a conductivity type of n-type as a second conductivity type. The first impurity layer 202 is, for example, a region formed by implanting impurity ions of phosphorus, arsenic, or the like. The first impurity layer 202 is electrically coupled with a drain electrode 161 in the vicinity of a point O. Therefore, a voltage from the terminal TVH of the power supply controller 100 shown in FIG. 1 is applied to the first impurity layer 202. In addition, as shown in FIG. 4, the first impurity layer 202 is electrically coupled with a source electrode 162.

The second impurity layer 203 is formed at the surface of the semiconductor substrate 201. The second impurity layer 203 is formed to surround the first impurity layer 202 in a plan view of the semiconductor substrate 201. The second impurity layer 203 has a circular shape in a plan view, and is of a conductivity type of p-type as a first conductivity type. The second impurity layer 203 is, for example, a region formed by implanting impurity ions of boron, boron fluoride, or the like. In addition, as shown in FIG. 3, the second impurity layer 203 is electrically coupled with a gate electrode 163.

Figure 2:
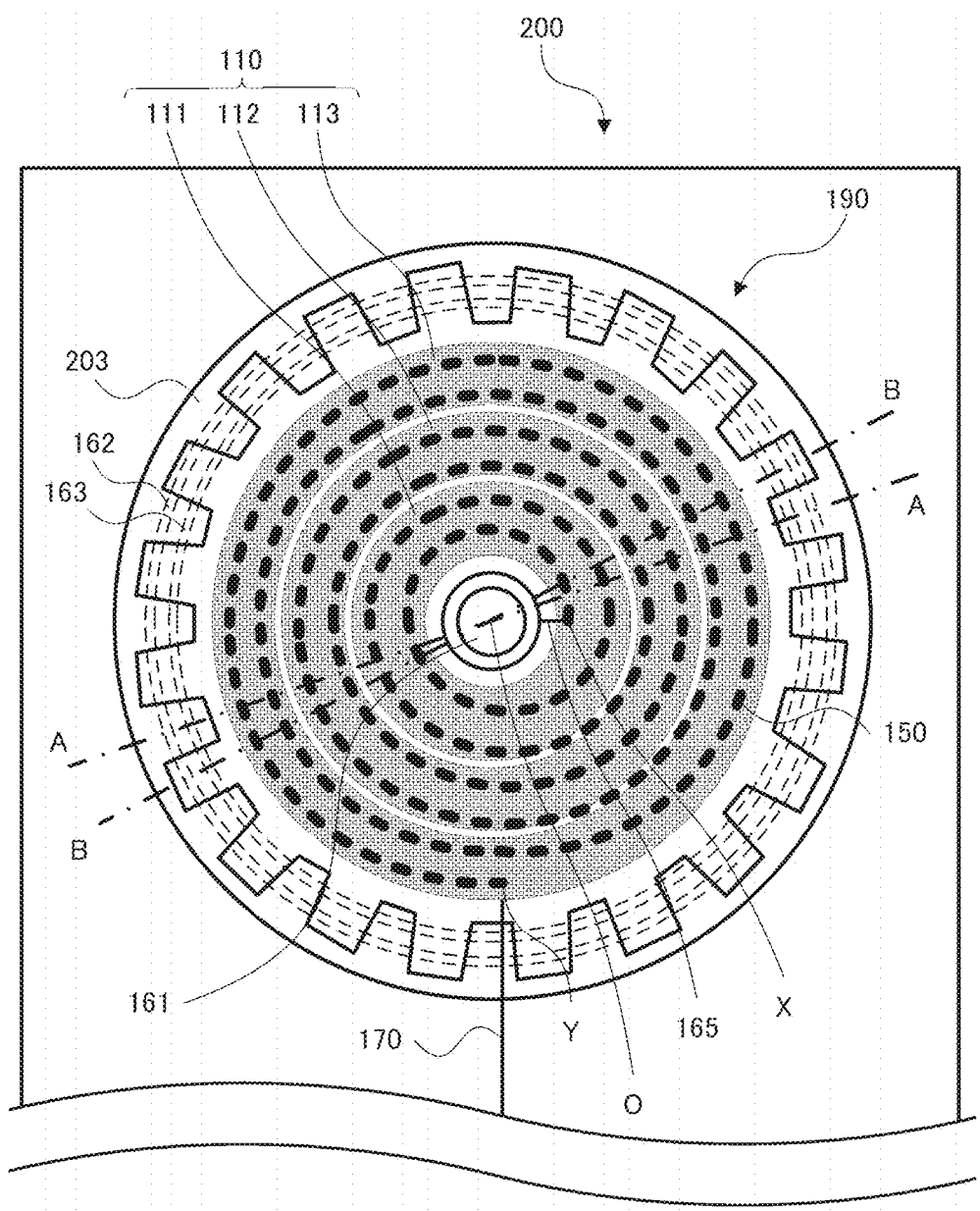
FIG. 2 is a plan view showing a schematic configuration of a semiconductor device.
Figure 3:
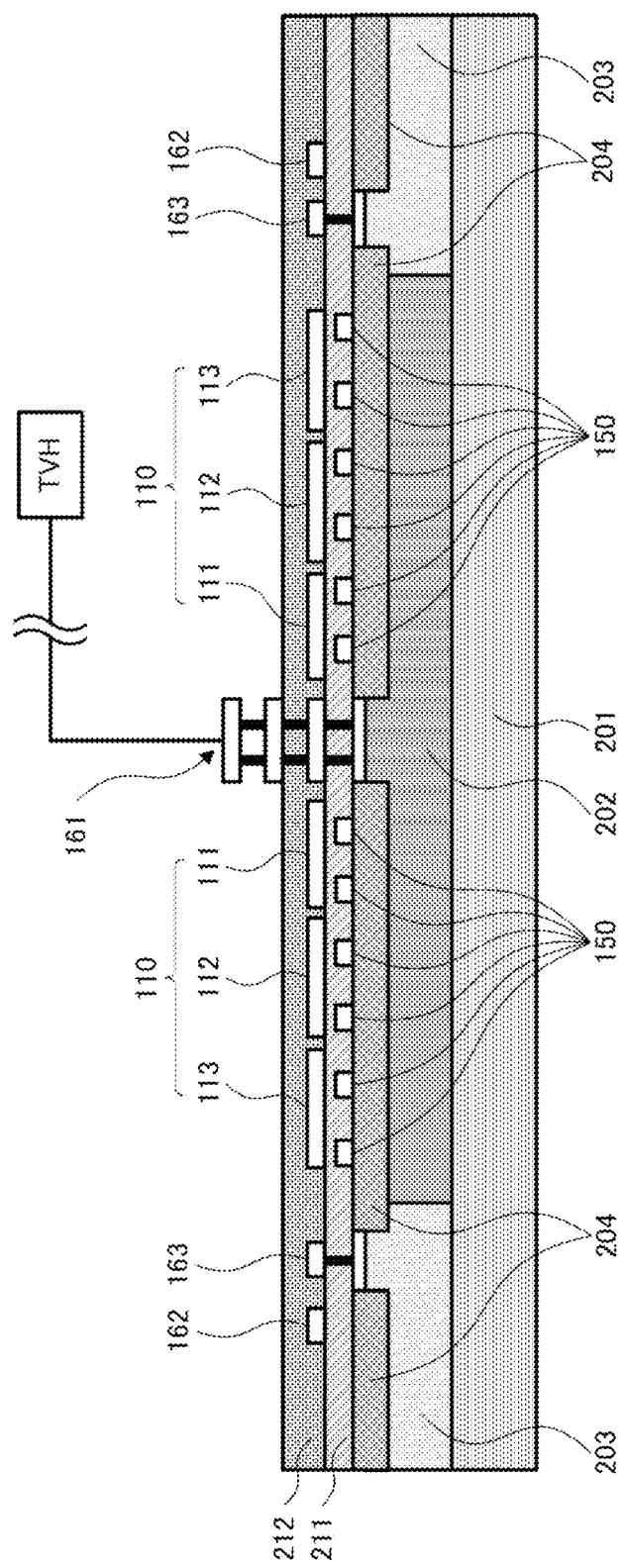
FIG. 3 is a cross-sectional view of the semiconductor device shown in FIG. 2 taken along a cutting line A-A.

The gate electrode 163 is formed in a ring shape, and is electrically coupled with the second impurity layer 203 at positions located at equal intervals along a circumferential direction (see FIGS. 2 and 3). Specifically, the gate electrode 163 is electrically coupled with the second impurity layer 203 at positions overlapping the cutting line A-A in a plan view.

Figure 4:
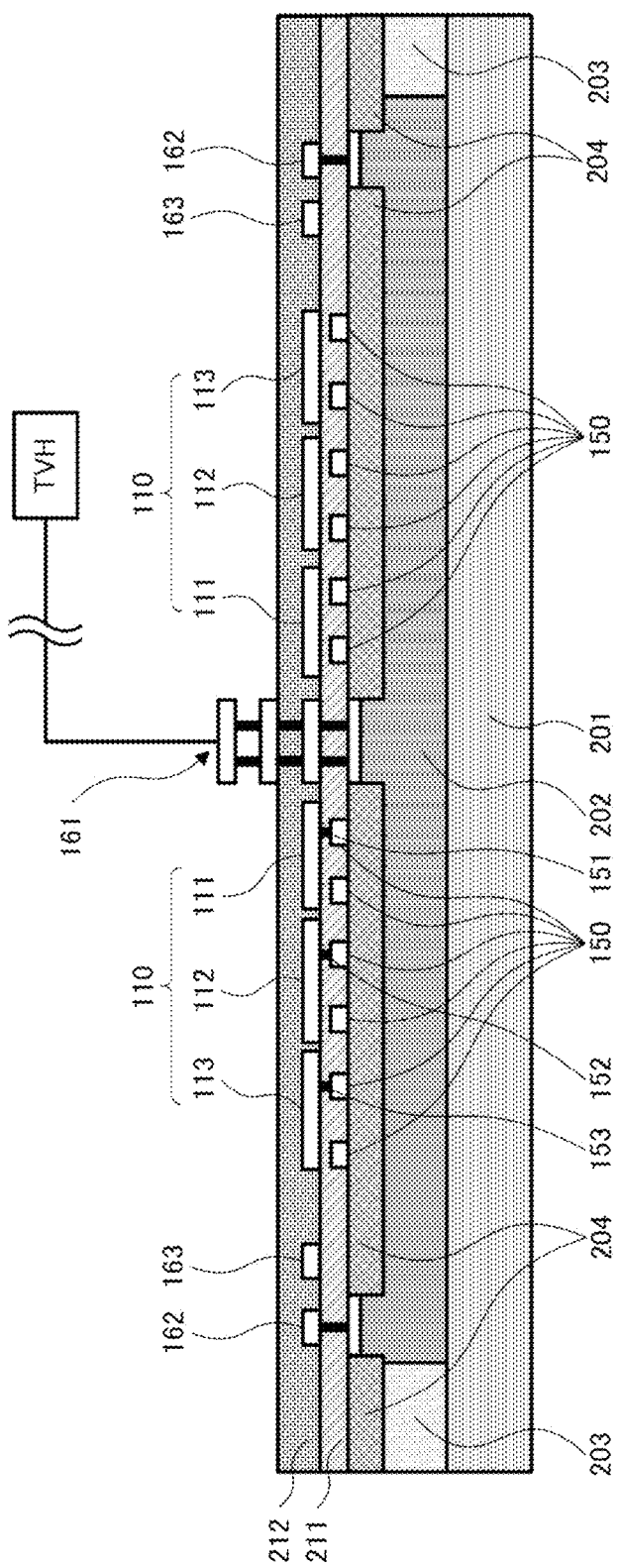
FIG. 4 is a cross-sectional view of the semiconductor device shown in FIG. 2 taken along a cutting line B-B.

In addition, the source electrode 162 is formed in a ring shape, and is electrically coupled with the first impurity layer 202 at positions located at equal intervals along the circumferential direction (see FIGS. 2 and 4). Specifically, the source electrode 162 is electrically coupled with the first impurity layer 202 at positions where the source electrode 162 overlaps the cutting line B-B in a plan view.

The insulating film 204 covers the first impurity layer 202. The insulating film 204 insulates, for example, the first impurity layer 202 and the second impurity layer 203 from the first interlayer insulating layer 211. The insulating film 204 is formed of a silicon oxide film or the like in a semiconductor process, and is formed by a CVD method, a sputtering method, or the like.

The resistive element 150 is provided on the insulating film 204 and has a spiral shape. As shown in FIG. 2, the elongated resistive element 150 is formed in a spiral shape from an inner periphery to an outer periphery while concentrically drawing a circular arc, and has a first end portion X on an inner peripheral side and a second end portion Y on an outer peripheral side. Therefore, as compared with a case where the resistive element 150 is linear, it is possible to secure a sufficient length and increase a resistance value of the resistive element 150.

As shown in FIG. 2, the first end portion X of the resistive element 150 is electrically coupled to a wiring 165. The wiring 165 is electrically coupled to the drain electrode 161. The drain electrode 161 is electrically coupled to the terminal THV of the power supply controller 100.

In addition, as shown in FIG. 2, the second end portion Y of the resistive element 150 is electrically coupled to a wiring 170. The wiring 170 is electrically coupled to the resistive element 140 provided in the power supply controller 100. The resistive elements 150 and 140 are provided on a JFET 190 formed in a circular shape in a plan view. In addition, a part of the resistive element 150 may be provided outside the JFET 190, and a part of the resistive elements 150 and the resistive elements 140 may be provided on the JFET 190.

The full-wave rectified voltage VH input to the terminal TVH of the power supply controller 100 is input to the drain electrode 161. The full-wave rectified voltage VH is stepped down, for example, from several hundreds of volts to several tens of volts or several volts by the step-down circuit 105 including the JFET 190 that is constituted by the first impurity layer 202, the second impurity layer 203, the drain electrode 161, the source electrode 162, the gate electrode 163, and the like. That is, in the resistive element 150, a potential at the first end portion X is the highest, and a potential at the second end portion Y is the lowest. The stepped down full-wave rectified voltage VH is input to the terminal TVcc of the power supply controller 100 via the start-up circuit (not shown) as the voltage Vcc.

The first interlayer insulating layer 211 covers the resistive element 150. The first interlayer insulating layer 211 insulates, for example, the resistive element 150 from the plurality of first conductive films 110. The first interlayer insulating layer 211 is formed of a silicon oxide film or the like in the semiconductor process, and is formed by the CVD method, the sputtering method, or the like.

The plurality of first conductive films 110 include a first conductive film 111, a first conductive film 112, and a first conductive film 113, are provided on the first interlayer insulating layer 211, and are electrically coupled with the resistive element 150. The plurality of first conductive films 110 are formed in a disk shape centered on the point O to cover the resistive element 150 in a plan view, and protect the resistive element 150, the first impurity layer 202, and the second impurity layer 203. The first conductive films 111 to 113 are formed in a concentric ring shape centered on the point O in a plan view. Inner diameters of the rings increase in an order of the first conductive film 111, the first conductive film 112 and the first conductive film 113, with the first conductive film 111 having the smallest inner diameter.

A width of the resistive element 150 is smaller than a width of the plurality of first conductive films 110. That is, the first conductive films 111 to 113 are formed to have the width larger than the width of the resistive element 150, and therefore, the first conductive films 111 to 113 can more reliably cover the entire resistive element 150. That is, the plurality of first conductive films 110 can cover the entire resistive element 150, and it is possible to reduce a possibility that foreign substances such as ions contained in the resin affect the resistive element 150, the first impurity layer 202, and the second impurity layer 203, and to prevent a decrease in performance of the semiconductor device 200.

The plurality of first conductive films 110 may be the same metal as the metal wiring used in the semiconductor device 200. The metal may be, for example, aluminum, copper, an alloy of aluminum and copper, or the like. In addition, the plurality of first conductive films 110 may be referred to as a shield metal or a shield material.

The plurality of first conductive films 110 are electrically coupled with the resistive element 150 at positions where the first conductive films 110 overlap the resistive element 150 in a plan view. Specifically, as shown in FIG. 4, the first conductive film 111 provided on the first interlayer insulating layer 211 and the resistive element 150 are electrically coupled by a contact 151. The first conductive film 112 and the resistive element 150 are electrically coupled by a contact 152. The first conductive film 113 and the resistive element 150 are electrically coupled by a contact 153.

As described above, in the resistive element 150, the potential at the first end portion X is the highest, and the potential at the second end portion Y is the lowest, and therefore, the potential of the resistive element 150 having a spiral shape decreases in an ascending order of a distance from the point O that corresponds to the center of the spiral. Therefore, V11>V12>V13, wherein V11 is a potential of the first conductive film 111, V12 is a potential of the first conductive film 112, and V13 is a potential of the first conductive film 113. That is, similarly to the potential of the resistive element 150, potentials of the plurality of first conductive films 110 decrease in an ascending order of a distance from the point O.

Accordingly, similarly to a potential distribution of the resistive element 150, in a potential distribution of the plurality of first conductive films 110, the potentials thereof decrease in an ascending order of the distance from the point O and an electric field strength in the first interlayer insulating layer 211 can be reduced, and therefore, the first interlayer insulating layer 211 may not be thickly formed. In addition, since the plurality of first conductive films 110 are formed to cover the resistive element 150, it is possible to reduce a possibility that foreign substances such as impurity ions in the resin affect the resistive element 150, the first impurity layer 202, and the second impurity layer 203.

When the plurality of first conductive films 110 and the resistive element 150 are not electrically coupled, the plurality of first conductive films 110 have indefinite potentials. In this case, a voltage of several hundreds of volts is applied to the first interlayer insulating layer 211, and the first interlayer insulating layer 211 may be broken. In contrast, when the first interlayer insulating layer 211 is thickly formed, a breakdown voltage of the first interlayer insulating layer 211 may increase to several hundreds of volts, but it is not realistic from the viewpoint of the cost, the number of processes, the manufacturing time, and the like.

As described above, in the first embodiment, the plurality of first conductive films 110 are divided into a plurality of conductive films and each of the conductive films is electrically coupled with the resistive element 150, so that the potential distribution of the plurality of first conductive films 110 can be brought close to the potential distribution of the resistive element 150. Specifically, the plurality of first conductive films 110 and the resistive element 150 are electrically coupled at three positions. Therefore, the electric field strength in the first interlayer insulating layer 211 can be reduced, and it is possible to reduce the possibility of breaking the first interlayer insulating layer 211.

In the present embodiment, since the plurality of first conductive films 110 are formed to cover the resistive element 150, it is possible to reduce the possibility that foreign substances contained in the resin sealing the semiconductor device 200 affect the resistive element 150, the first impurity layer 202, and the second impurity layer 203, and to prevent the decrease in performance of the semiconductor device 200.

3. Second Embodiment

Figure 5:
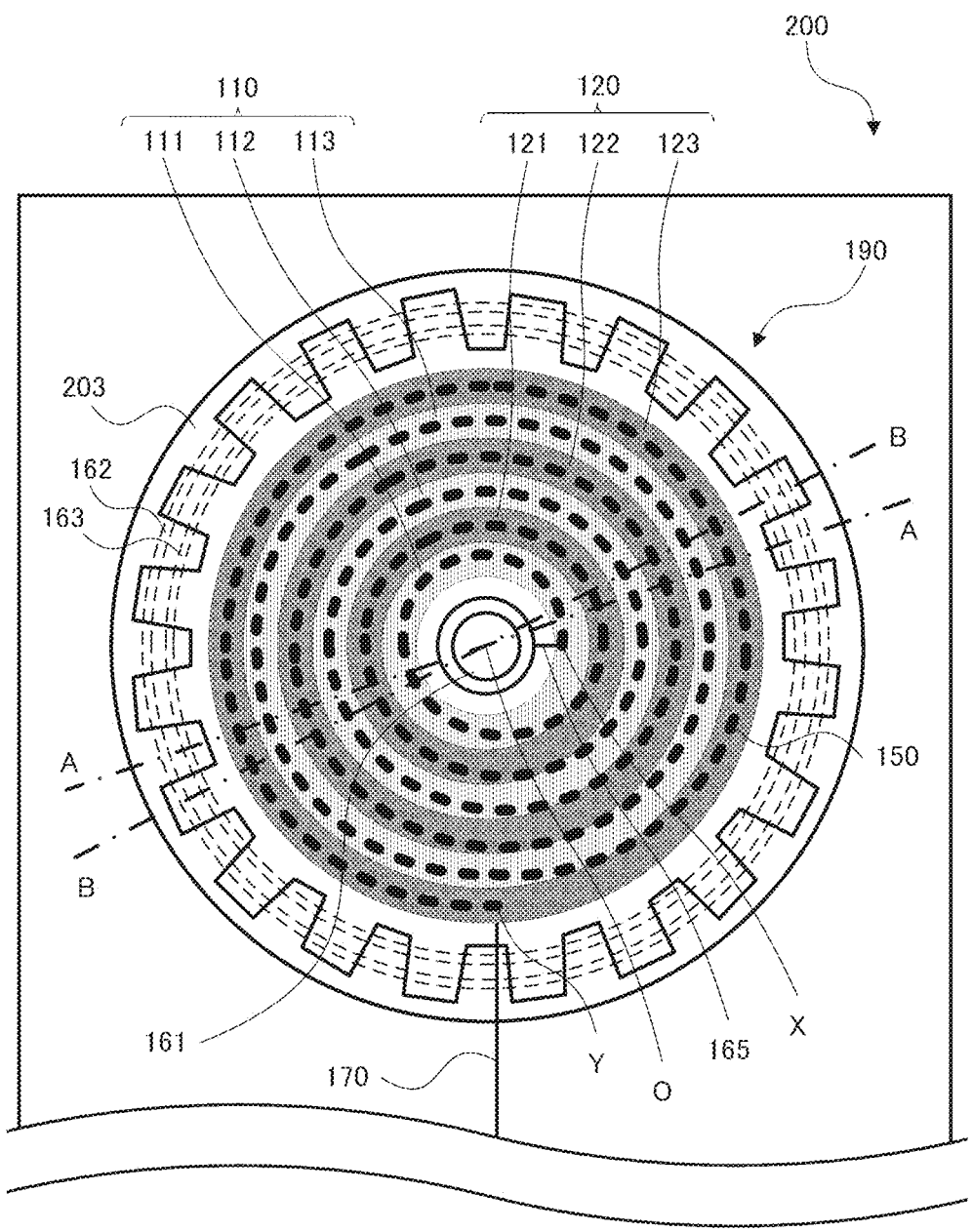
FIG. 5 is a plan view showing a schematic configuration of a semiconductor device in a second embodiment.
Figure 6:
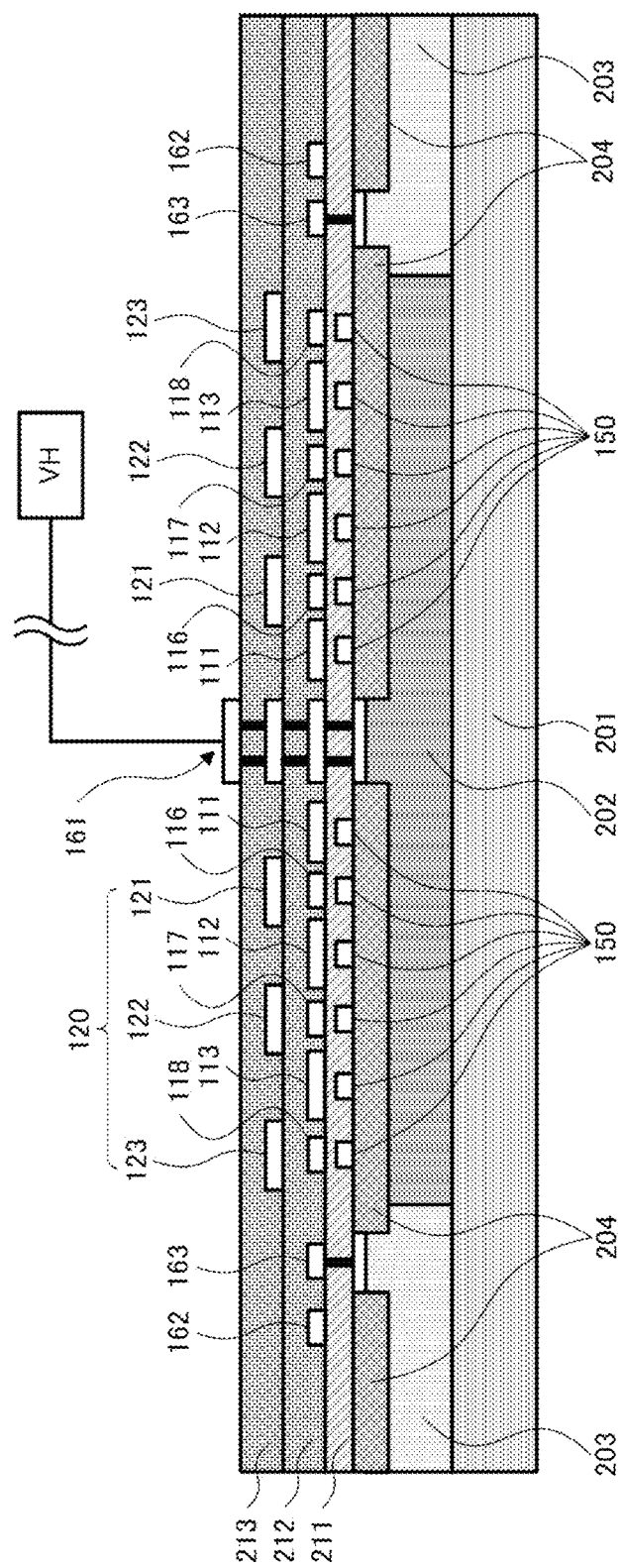
FIG. 6 is a cross-sectional view of the semiconductor device shown in FIG. 5 taken along a cutting line A-A.
Figure 7:
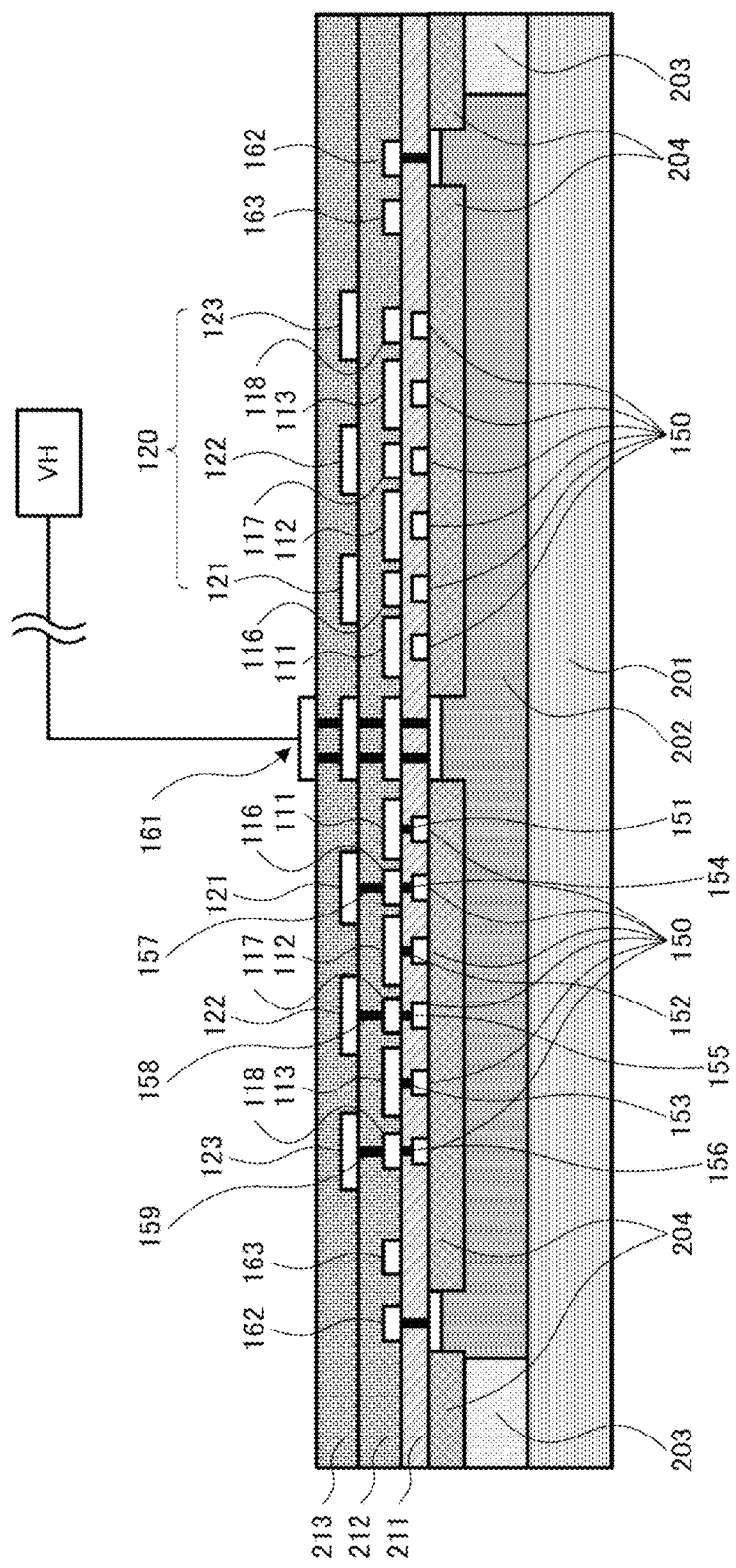
FIG. 7 is a cross-sectional view of the semiconductor device shown in FIG. 5 taken along a cutting line B-B.

The semiconductor device 200 in a second embodiment will be described with reference to FIGS. 5 to 7. The same configurations as those of the semiconductor device 200 in the first embodiment are denoted by the same reference signs, and the description thereof will be omitted or simplified. The semiconductor device 200 in the second embodiment includes a second interlayer insulating layer 212 and a plurality of second conductive films 120.

The second interlayer insulating layer 212 covers the plurality of first conductive films 110. The second interlayer insulating layer 212 insulates, for example, the plurality of first conductive films 110 from the plurality of second conductive films 120. The second interlayer insulating layer 212 is formed of a silicon oxide film or the like in the semiconductor process, and is formed by the CVD method, the sputtering method, or the like.

The plurality of second conductive films 120 include a second conductive film 121, a second conductive film 122, and a second conductive film 123, are provided on the second interlayer insulating layer 212, and are electrically coupled with the resistive element 150. The plurality of second conductive films 120 are formed in a disk shape centered on the point O to cover the resistive element 150 in a plan view, and protect the resistive element 150, the first impurity layer 202, and the second impurity layer 203. The second conductive films 121 to 123 are formed in a concentric ring shape centered on the point O in a plan view. Inner diameters of the rings increase in an order of the second conductive film 121, the second conductive film 122 and the second conductive film 123, with the second conductive film 121 having the smallest inner diameter.

The plurality of second conductive films 120 are disposed to cover gaps between the plurality of first conductive films 110 in a plan view. Specifically, the second conductive film 121 is disposed to cover a gap between the first conductive film 111 and the first conductive film 112 in a plan view. The second conductive film 122 is disposed to cover a gap between the first conductive film 112 and the first conductive film 113 in a plan view. Therefore, since the plurality of second conductive films 120 are disposed to cover the gaps between the plurality of first conductive films 110, the resistive element 150, the first impurity layer 202, and the second impurity layer 203 can be more reliably covered with the plurality of first conductive films 110 and the plurality of second conductive films 120.

The width of the resistive element 150 is smaller than a width of the plurality of second conductive films 120. That is, the second conductive films 121 to 123 are formed to have the width larger than the width of the resistive element 150, and therefore, the second conductive films 121 to 123 can more reliably cover the entire resistive element 150. That is, the plurality of second conductive films 120 can cover the entire resistive elements 150, and it is possible to reduce the possibility that the foreign substances such as the impurity ions in the resin affect the first impurity layer 202 and the second impurity layer 203, and to prevent the decrease in performance of the semiconductor device 200.

The plurality of second conductive films 120 may be the same metal as the metal wiring used in the semiconductor device 200. The metal may be, for example, aluminum, copper, an alloy of aluminum and copper, or the like. In addition, the plurality of second conductive films 120 may be referred to as a shield metal or a shield material.

The plurality of second conductive films 120 are electrically coupled with the resistive element 150 at positions where the second conductive films 120 overlap the resistive element 150 in a plan view. As shown in FIG. 7, in order to electrically couple the second conductive films 121 to 123 with the resistive element 150, first conductive films 116 to 118 are formed on the first interlayer insulating layer 211.

The first conductive films 116 to 118 are formed in a concentric ring shape centered on the point O in a plan view. Inner diameters of the rings increase in an order of the first conductive film 116, the first conductive film 117 and the first conductive film 118, with the first conductive film 116 having the smallest inner diameter. The first conductive film 116 is formed in the gap between the first conductive film 111 and the first conductive film 112, and the first conductive film 117 is formed between the first conductive film 112 and the first conductive film 113. In addition, the first conductive film 118 is formed on an outer side of the first conductive film 113.

The resistive element 150 and the first conductive film 116 are electrically coupled by a contact 154, and the first conductive film 116 and the second conductive film 121 are electrically coupled by a contact 157. The resistive element 150 and the first conductive film 117 are electrically coupled by a contact 155, and the first conductive film 117 and the second conductive film 122 are electrically coupled by a contact 158. The resistive element 150 and the first conductive film 118 are electrically coupled by a contact 156, and the first conductive film 118 and the second conductive film 123 are electrically coupled by a contact 159.

Therefore, $V21>V22>V23$, wherein $V21$ is a potential of the second conductive film 121, $V22$ is a potential of the second conductive film 122, and $V23$ is a potential of the second conductive film 123. When the potentials of the second conductive films 121 to 123 and the potentials of the first conductive films 111 to 113 are put together and compared with one another, $V11>V21>V12>V22>V13>V23$ is satisfied.

Accordingly, similarly to the potential distribution of the resistive element 150, in potential distributions of the plurality of first conductive films 110 and the plurality of second conductive films 120, the potentials thereof decrease in an ascending order of the distance from the point O, and therefore, it is possible to reduce electric field strengths in the first interlayer insulating layer 211 and the second interlayer insulating layer 212. Therefore, the first interlayer insulating layer 211 and the second interlayer insulating layer 212 may not be thickly formed. In the second embodiment, since the plurality of first conductive films 110 and the plurality of second conductive films 120 are formed to cover the resistive element 150, the first impurity layer 202, and the second impurity layer 203, it is possible to reduce the possibility that the foreign substances such as the impurity ions in the resin affect the resistive element 150, the first impurity layer 202, and the second impurity layer 203.

When the plurality of first conductive films 110, the plurality of second conductive films 120, and the resistive element 150 are not electrically coupled, the plurality of first conductive films 110 and the plurality of second conductive films 120 have indefinite potentials. In this case, a voltage of several hundreds of volts is applied to the first interlayer insulating layer 211 and the second interlayer insulating layer 212, and the first interlayer insulating layer 211 and the second interlayer insulating layer 212 may be broken. In contrast, when the first interlayer insulating layer 211 and the second interlayer insulating layer 212 are thickly formed, breakdown voltages of the first interlayer insulating layer 211 and the second interlayer insulating layer 212 may increase to several hundreds of volts, but it is not realistic from the viewpoint of the cost, the number of processes, the manufacturing time, and the like.

As described above, in the second embodiment, the plurality of first conductive films 110 and the plurality of second conductive films 120 are divided into a plurality of conductive films and each of the conductive films is electrically coupled with the resistive element 150, so that the potential distributions of the plurality of first conductive films 110 and the plurality of second conductive films 120 can be brought close to the potential distribution of the resistive element 150. Specifically, the plurality of first conductive films 110 and the plurality of second conductive films 120 are electrically coupled with the resistive element 150 at six positions. Therefore, as compared with the case of the first embodiment, the potential distributions of the plurality of first conductive films 110 and the plurality of second conductive films 120 can be brought close to the potential distribution of the resistive element 150. Therefore, the electric field strengths in the first interlayer insulating layer 211 and the second interlayer insulating layer 212 can be reduced, and it is possible to reduce the possibility of breaking the first interlayer insulating layer 211 and the second interlayer insulating layer 212.

In addition, in the second embodiment, the resistive element 150, the first impurity layer 202, and the second impurity layer 203 are covered more reliably with the plurality of first conductive films 110 and the plurality of second conductive films 120. Therefore, it is possible to reduce the possibility that the foreign substances contained in the resin sealing the semiconductor device 200 affect the first impurity layer 202 and the second impurity layer 203, and to prevent the decrease in performance of the semiconductor device 200.

In addition, in the second embodiment, the plurality of first conductive films 110 may include the first conductive films 111 to 113, or may include the first conductive films 111 to 113 and the first conductive films 116 to 118. The first conductive films 116 to 118 are conductive layers for electrically coupling the second conductive films 121 to 123 with the resistive element 150, and are conductive layers that cover the resistive element 150, the first impurity layer 202, and the second impurity layer 203.

Figure 8:
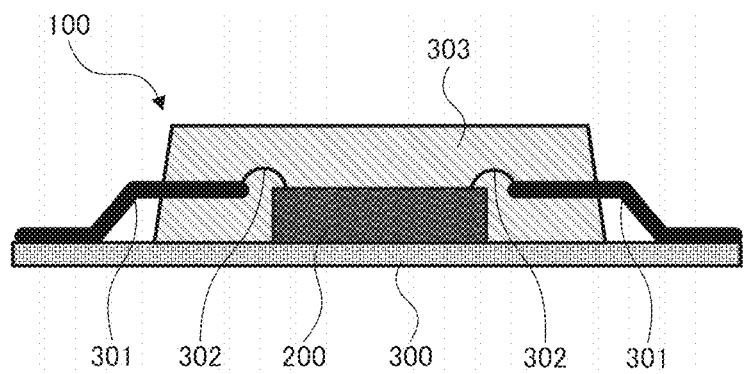
FIG. 8 is a diagram showing an example of a configuration of a power supply controller.

Mounting of the power supply controller 100 will be described with reference to FIG. 8. As shown in FIG. 8, the power supply controller 100 includes a lead wire 301, a wire 302, a sealing material 303, and the semiconductor device 200. The lead wire 301 is electrically coupled with the wire 302, and the wire 302 is electrically coupled with an electrode provided in the semiconductor device 200. The sealing material 303 seals the semiconductor device 200, the wire 302, and a part of the lead wire 301.

The power supply controller 100 is mounted on a surface of a package substrate 300. A wiring pattern formed on the package substrate 300 and the lead wire 301 are electrically coupled, and a signal can be input and output between an external device (not shown) and the semiconductor device 200. The semiconductor device 200 in the present disclosure is one of components constituting the power supply controller 100, and the power supply controller 100 may be the semiconductor device 200.

In the above embodiment, the plurality of first conductive films 110 and the plurality of second conductive films 120 are electrically coupled with the resistive element 150 at positions where the first conductive films 110 and the second conductive films 120 overlap the cutting line B-B in a plan view, but the present disclosure is not limited thereto. It is possible that the plurality of first conductive films 110 and the resistive element 150 are electrically coupled at n positions. The n is an integer of 2 or more.

For example, when the first conductive film 111 and the resistive element 150 are to be electrically coupled at n positions, the first conductive film 111 formed in a ring shape may be divided into n conductive films, and each one of the n divided conductive films of the first conductive films 111 may be electrically coupled with the resistive element 150 at one position, or may be electrically coupled with the resistive element 150 at a plurality of positions.

However, when one of the n divided conductive films of the first conductive film 111 is electrically coupled with the resistive element 150 at a plurality of positions, short circuit may occur. Therefore, it is preferable that each one of the n divided conductive films of the first conductive film 111 is electrically coupled with the resistive element 150 at one position. In addition, the number of coupling positions of the first conductive film 111 and the resistive element 150 is preferably equal to the number of divisions of the first conductive film 111. Accordingly, it is possible to reduce a possibility that the divided first conductive film 111 has an indefinite potential.

When n is increased, the potential distribution of the first conductive film 111 is brought close to the potential distribution of the resistive element 150, and the electric field strength in the first interlayer insulating layer 211 can be further reduced. Therefore, it is possible to further reduce the possibility of breaking the first interlayer insulating layer 211. Accordingly, each of the conductive films, which constitute the plurality of first conductive films 110 and the plurality of second conductive films 120, may be electrically coupled with the resistive element 150 at any n positions.

Although the plurality of first conductive films 110 and the plurality of second conductive films 120 are formed in a ring shape in the above embodiment, the plurality of first conductive films 110 and the plurality of second conductive films 120 may be formed in a spiral shape similarly to the resistive element 150. Since the plurality of first conductive films 110 and the plurality of second conductive films 120 have the same shape as the resistive element 150, the plurality of first conductive films 110 and the plurality of second conductive films 120 can more reliably cover the resistive element 150.

For example, the first conductive film 111 may be divided into m conductive films, and each one of the m divided conductive films of the first conductive film may be electrically coupled with the resistive element 150 at one position. The m is an integer of 2 or more. As described above, by increasing m, the electric field strengths in the first interlayer insulating layer 211 and the second interlayer insulating layer 212 can be reduced, and it is possible to reduce the possibility of breaking the first interlayer insulating layer 211.

4. Effects

As described above, the semiconductor device 200 according to the present disclosure includes the plurality of first conductive films 110. Since the plurality of first conductive films 110 are provided on the first interlayer insulating layer 211 covering the resistive element 150, the resistive element 150, the first impurity layer 202, and the second impurity layer 203 can be protected. Accordingly, it is possible to prevent the decrease in performance of the semiconductor device 200 caused by the influence of the foreign substances such as the ions contained in the resin used for the resin sealing. Furthermore, since the plurality of first conductive films 110 and the resistive element 150 are electrically coupled, the plurality of first conductive films 110 and the resistive element 150 have the same potential, and it is possible to reduce the electric field strength in the first interlayer insulating layer 211. Accordingly, it is possible to reduce the possibility of breaking the first interlayer insulating layer 211.

In the semiconductor device 200 according to the present disclosure, the width of the resistive element 150 is smaller than the width of the plurality of first conductive films 110, and therefore, the resistive element 150 can be protected more reliably.

In addition, in the semiconductor device 200 according to the present disclosure, the plurality of first conductive films 110 are electrically coupled with the resistive element 150 at a plurality of positions, and the potential distribution of the plurality of first conductive films 110 can be brought close to the potential distribution of the resistive element 150. Accordingly, it is possible to reduce electric field strengths in the plurality of first conductive films 110, and it is possible to reduce the possibility of breaking the first interlayer insulating layer 211.

In addition, in the semiconductor device 200 according to the present disclosure, the gaps between the plurality of first conductive films 110 are covered with the plurality of second conductive films 120 in a plan view, and therefore, the resistive element 150, the first impurity layer 202, and the second impurity layer 203 can be protected more reliably. Furthermore, since the plurality of first conductive films 110 are electrically coupled with the resistive element 150, the plurality of first conductive films 110 and the resistive element 150 have the same potential, and it is possible to reduce the electric field strength in the first interlayer insulating layer 211. Accordingly, it is possible to reduce the possibility of breaking the first interlayer insulating layer 211. In addition, since the plurality of second conductive films 120 are electrically coupled with the resistive element 150, the plurality of second conductive films 120 and the resistive element 150 have the same potential, and it is possible to reduce the electric field strength in the second interlayer insulating layer 212. Accordingly, it is possible to reduce the possibility of breaking the second interlayer insulating layer 212.

In addition, in the semiconductor device 200 according to the present disclosure, the width of the resistive element 150 is smaller than the width of the plurality of second conductive films 120, and therefore, the resistive element 150 can be protected more reliably.

In addition, in the semiconductor device 200 according to the present disclosure, the plurality of second conductive films 120 are electrically coupled with the resistive element 150 at the positions where the plurality of second conductive films 120 overlap the resistive element 150 in a plan view, and the potential distribution of the plurality of second conductive films 120 can be brought close to the potential distribution of the resistive element 150. Accordingly, it is possible to reduce the electric field strength in the second interlayer insulating layer 212, and it is possible to reduce the possibility of breaking the second interlayer insulating layer 212.

Although the embodiments and modifications are described above, the present disclosure is not limited to these embodiments, and can be implemented in various modes without departing from the gist thereof. For example, the above embodiments may be combined as appropriate.

The present disclosure includes a configuration (for example, a configuration having the same function, method and result, or a configuration having the same object and effects) substantially the same as the configurations described in the embodiments. The present disclosure includes a configuration in which a non-essential portion of the configuration described in the embodiments is replaced. In addition, the present disclosure includes a configuration having the same effects as those of the configuration described in the embodiments, or a configuration capable of achieving the same object. The present disclosure includes a configuration in which a known technique is added to the configuration described in the embodiments.

The following contents are derived from the embodiments and the modification described above.

An aspect of a semiconductor device includes:
a semiconductor substrate of a first conductivity type;
a first impurity layer of a second conductivity type formed at a surface of the semiconductor substrate;
a second impurity layer of a first conductivity type formed to surround the first impurity layer of the semiconductor substrate;
an insulating film configured to cover at least the first impurity layer;
a resistive element provided on the insulating film and having a spiral shape;
a first interlayer insulating layer configured to cover the resistive element; and
a plurality of first conductive films provided on the first interlayer insulating layer and electrically coupled with the resistive element.

According to the semiconductor device, since the plurality of first conductive films are provided on the first interlayer insulating layer covering the resistive element, it is possible to protect the resistive element, the first impurity layer, and the second impurity layer from foreign substances such as ions contained in a resin used for resin sealing, and it is possible to prevent a decrease in performance. Furthermore, since the plurality of first conductive films and the resistive element are electrically coupled, the plurality of first conductive films and the resistive element have the same potential, and it is possible to reduce an electric field strength in the first interlayer insulating layer. Accordingly, it is possible to reduce a possibility of breaking the first interlayer insulating layer.

In the aspect of the semiconductor device, a width of the resistive element may be smaller than a width of the plurality of first conductive films.

According to the semiconductor device, the width of the resistive element is smaller than the width of the plurality of first conductive films, and therefore, the resistive element can be protected more reliably.

In the aspect of the semiconductor device, the plurality of first conductive films may be electrically coupled with the resistive element at a position where the plurality of first conductive films overlap the resistive element in a plan view.

According to the semiconductor device, the plurality of first conductive films are electrically coupled with the resistive element at a plurality of positions, and a potential distribution of the plurality of first conductive films can be brought close to a potential distribution of the resistive element. Accordingly, it is possible to reduce the electric field strength in the first interlayer insulating layer, and it is possible to reduce the possibility of breaking the first interlayer insulating layer.

The aspect of the semiconductor device further includes: a second interlayer insulating layer configured to cover the plurality of first conductive films; and a plurality of second conductive films provided on the second interlayer insulating layer and electrically coupled with the resistive element, in which the plurality of second conductive films may be disposed to cover a gap between the plurality of first conductive films in a plan view.

According to the semiconductor device, the gap between the plurality of first conductive films is covered by the plurality of second conductive films in a plan view, and therefore, the resistive element, the first impurity layer, and the second impurity layer can be protected more reliably. Furthermore, since the plurality of second conductive films and the resistive element are electrically coupled, the plurality of second conductive films and the resistive element have the same potential, and it is possible to reduce the electric field strength in the first interlayer insulating layer and an electric field strength in the second interlayer insulating layer. Accordingly, it is possible to reduce a possibility of breaking the first interlayer insulating layer and the second interlayer insulating layer.

In the aspect of the semiconductor device, the width of the resistive element may be smaller than a width of the plurality of second conductive films.

According to the semiconductor device, the width of the resistive element is smaller than the width of the plurality of second conductive films, and therefore, the resistive element can be protected more reliably.

In the aspect of the semiconductor device, the plurality of second conductive films may be electrically coupled with the resistive element at a position where the plurality of second conductive films overlap the resistive element in a plan view.

According to the semiconductor device, the plurality of second conductive films are electrically coupled with the resistive element at a plurality of positions where the plurality of second conductive films overlap the resistive element in a plan view, and a potential distribution of the plurality of second conductive films can be brought close to the potential distribution of the resistive element. Accordingly, it is possible to reduce the electric field strength in the first interlayer insulating layer and the electric field strength in the second interlayer insulating layer, and it is possible to reduce the possibility of breaking the first interlayer insulating layer and the second interlayer insulating layer.

What is claimed is:

1. A semiconductor device, comprising:
   a semiconductor substrate of a first conductivity type;
   a first impurity layer of a second conductivity type formed at a surface of the semiconductor substrate;
   a second impurity layer of the first conductivity type formed to surround the first impurity layer of the semiconductor substrate;
   an insulating film configured to cover at least the first impurity layer;
   a resistive element provided on the insulating film and having a spiral shape;
   a first interlayer insulating layer configured to cover the resistive element;
   a plurality of first conductive films provided on the first interlayer insulating layer and electrically coupled with the resistive element;
   a second interlayer insulating layer configured to cover the plurality of first conductive films; and
   a plurality of second conductive films provided on the second interlayer insulating layer and electrically coupled with the resistive element, wherein
   the plurality of second conductive films are disposed to cover a gap between the plurality of first conductive films in a plan view.

2. The semiconductor device according to claim 1, wherein
   a width of the resistive element is smaller than a width of the plurality of second conductive films.

3. The semiconductor device according to claim 1, wherein
   the plurality of second conductive films are electrically coupled with the resistive element at a position where the plurality of second conductive films overlap the resistive element in the plan view.

* * * * *